(12) United States Patent
Wallace et al.

(10) Patent No.: US 6,670,022 B1
(45) Date of Patent: Dec. 30, 2003

(54) NANOPOROUS DIELECTRIC FILMS WITH GRADED DENSITY AND PROCESS FOR MAKING SUCH FILMS

(75) Inventors: Stephen Wallace, Albuquerque, NM (US); Douglas M. Smith, Albuquerque, NM (US); Teresa Ramos, Albuquerque, NM (US); Kevin H. Rodrick, Albuquerque, NM (US); James S. Drage, Fremont, CA (US)

(73) Assignee: Honeywell International, Inc., Morristown, NJ (US)

( * ) Notice: Subject to any disclaimer, the term of this patent is extended or adjusted under 35 U.S.C. 154(b) by 203 days.

(21) Appl. No.: 09/706,028

(22) Filed: Nov. 3, 2000

Related U.S. Application Data

(63) Continuation-in-part of application No. 09/046,474, filed on Mar. 25, 1998, now abandoned.
(60) Provisional application No. 60/043,261, filed on Apr. 17, 1997.
(51) Int. Cl.$^7$ .............................. B32B 3/00; B32B 5/14; H01L 23/58; H01L 23/52; H01L 29/40
(52) U.S. Cl. ..................... 428/156; 428/170; 428/304.4; 428/312.6; 257/634; 257/632; 257/638; 257/760; 257/759; 427/96
(58) Field of Search .............................. 428/304.4, 156, 428/312.6, 170; 257/634, 632, 638, 759, 760; 427/96

(56) References Cited

U.S. PATENT DOCUMENTS

| | | | | |
|---|---|---|---|---|
| 5,523,615 A | * | 6/1996 | Cho et al. ..................... 257/632 |
| 5,548,159 A | | 8/1996 | Jeng ........................... 257/634 |
| 5,561,318 A | * | 10/1996 | Gnade et al. ................ 257/638 |
| 5,807,607 A | * | 9/1998 | Smith et al. .................. 427/96 |
| 5,847,443 A | * | 12/1998 | Cho et al. ..................... 257/632 |
| 5,955,140 A | * | 9/1999 | Smith et al. .................. 427/96 |
| 6,140,252 A | * | 10/2000 | Cho et al. ..................... 438/781 |
| 6,171,687 B1 | * | 1/2001 | Leung et al. ............. 428/304.4 |
| 6,171,945 B1 | * | 1/2001 | Mandal et al. .............. 438/622 |

FOREIGN PATENT DOCUMENTS

| | | |
|---|---|---|
| EP | 0687004 | 12/1995 |
| EP | 0775669 | 5/1997 |
| WO | WO 92/03378 | 3/1992 |

\* cited by examiner

*Primary Examiner*—Harold Pyon
*Assistant Examiner*—Catherine A. Simone
(74) *Attorney, Agent, or Firm*—Roberts & Mercanti, LLP

(57) ABSTRACT

The present invention relates to nanoporous dielectric films and to a process for their manufacture. A substrate having a plurality of raised lines on its surface is provided with a relatively high porosity, low dielectric constant, silicon containing polymer composition positioned between the raised lines and a relatively low porosity, high dielectric constant, silicon containing composition positioned on the lines.

21 Claims, 1 Drawing Sheet

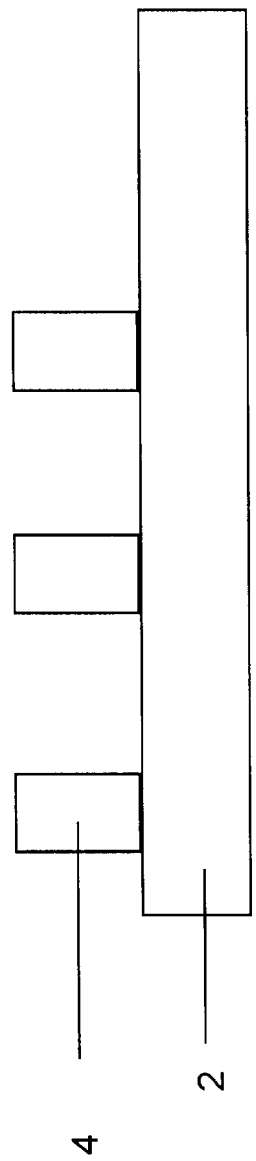
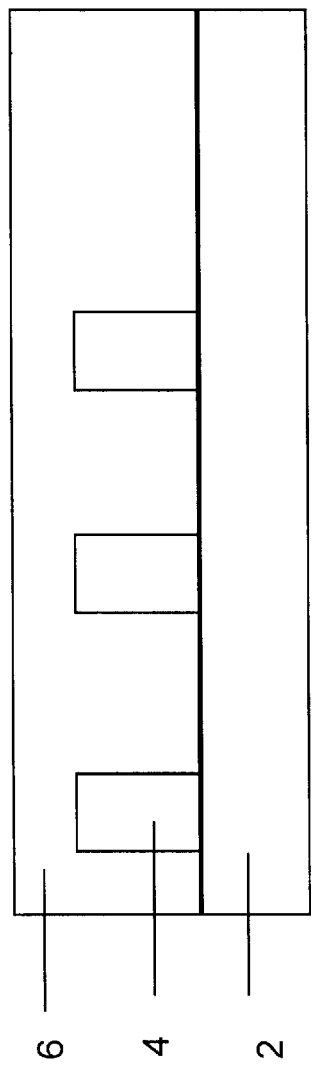
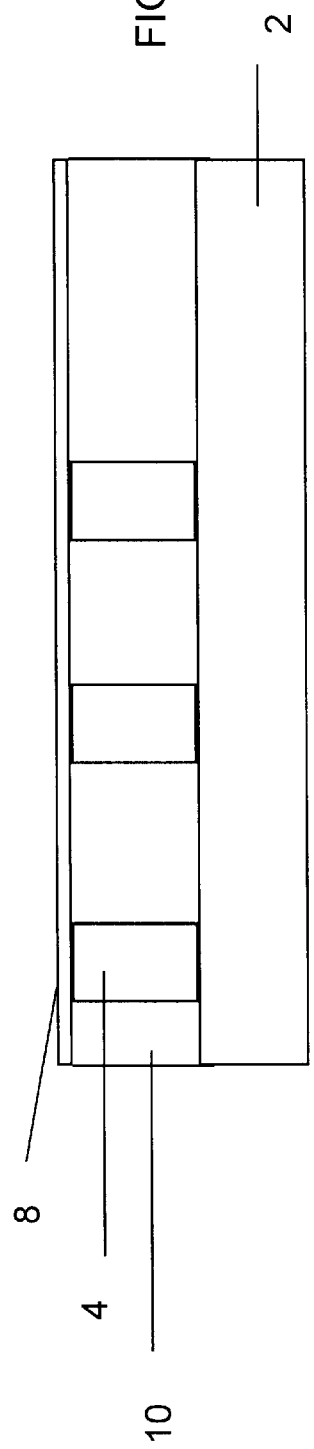

NANOPOROUS DIELECTRIC FILMS WITH GRADED DENSITY AND PROCESS FOR MAKING SUCH FILMS

CROSS REFERENCE TO RELATED APPLICATION

This application claims the benefit of provisional application 60/043,261 filed Apr. 17, 1997 which is incorporated herein by reference. This application is a continuation-in-part of application Ser. No. 09/046,474 filed Mar. 25, 1998, now abandoned, which is incorporated herein by reference.

BACKGROUND OF THE INVENTION

1. Field of the Invention

The present invention relates to nanoporous dielectric films and to a process for their manufacture. Such films are useful in the production of integrated circuits.

2. Description of the Prior Art

As feature sizes in the production of integrated circuits approach 0.25 μm and below, problems with interconnect RC delay, power consumption and crosstalk all become more significant. Integration of low dielectric constant (K) materials for interlevel dielectric (ILD) and intermetal dielectric (IMD) applications partially mitigate these problems but each of the material candidates having K significantly lower than currently employed dense silica suffer from disadvantages. Most low K materials developments emphasize spin-on-glasses (SOG's) and fluorinated plasma CVD (chemical vapor disposition) $SiO_2$ with K of >3. A number of organic and inorganic polymers have K in the range of 2.2 to 3.5, however, these suffer from a number of problems including low thermal stability, poor mechanical properties including low glass transition temperature (T), sample outgassing, and long term reliability questions.

Another approach has been to employ nanoporous silica which can have dielectric constants for bulk samples in the range of 1 to 3. Porous silica is attractive because it employs similar precursors (e.g., TEOS, tetraethoxysilane) as used for SOG's and CVD $SiO_2$ and because of the ability to carefully control pore size and size distribution. In addition to low dielectric constant, nanoporous silica offers other advantages for microelectronics including thermal stability up to 900° C., small pore size (<<microelectronics features), use of materials, silica and precursors (e.g., TEOS), that are widely used in the semiconductor industry, the ability to tune dielectric constant over a wide range and deposition using similar tools as employed for conventional SOG processing.

Although high porosity leads to a lower dielectric constant than corresponding dense materials, additional compositions and processes may be introduced as compared to a denser material. Materials issues include the need for having all pores significantly smaller than circuit feature sizes, the strength decrease associated with porosity, and the role of surface chemistry on dielectric constant and environmental stability. Density (or the inverse, porosity) is the key nanoporous silica parameter controlling property of importance for dielectrics. Properties of nanoporous silica may be varied over a continuous spectrum from the extremes of an air gap at a porosity of 100% to dense silica with a porosity of 0%. As density increases, dielectric constant and mechanical strength increase but the pore size decreases. This suggests that the optimum density range for semiconductor applications is not the very low densities associated with K~1 but rather, higher densities which yield higher strength and smaller pore size.

Nanoporous silica films can be fabricated by using a mixture of a solvent and a silica precursor which is deposited onto a silicon wafer by conventional methods of spincoating, dip-coating, etc. The precursor polymerizes after deposition and the resulting layer is sufficiently strong such that it does not shrink during drying. Film thickness and density/dielectric constant can be controlled independently by using a mixture of two solvents with dramatically different volatility. The more volatile solvent evaporates during and immediately after precursor deposition. The silica precursor, typically, a partially hydrolyzed and condensed product of TEOS, is polymerized by chemical and/or thermal means until it forms a gel layer. The second solvent is then removed by increasing the temperature. Assuming that no shrinkage occurs after gelation, the density/dielectric constant of the final film is fixed by the volume ratio of low volatility solvent to silica. EP patent application EP 0 775 669 A2, which is incorporated herein by reference, shows a method for producing a nanoporous silica film with uniform density throughout the film thickness. The preferred method for producing nanoporous dielectrics is through the use of sol-gel techniques whereby a sol, which is a colloidal suspension of solid particles in a liquid, transforms into a gel due to growth and interconnection of the solid particles. One theory is that through continued reactions within the sol, one or more molecules within the sol may eventually reach macroscopic dimensions so that they form a solid network which extends substantially throughout the sol. At this point, called the gel point, the substance is said to be a gel. By this definition, a gel is a substance that contains a continuous solid skeleton enclosing a continuous liquid phase. As the skeleton is porous, the term "gel" as used herein means an open-pored solid structure enclosing a pore fluid.

It would be desirable to produce a nanoporous silica with a relatively lower density, and hence lower dielectric constant, for the insulator between metal lines and a higher density, stronger, porous layer on top of the lines. In principle, this can be accomplished by performing multiple depositions using precursors with different solvent/silica ratios. However, that approach has a high cost because of the multiple deposition and drying/baking steps that must be used.

SUMMARY OF THE INVENTION

The invention provides a multidensity nanoporous dielectric coated substrate which comprises a substrate, a plurality of raised lines on the substrate, a single, monolithic nanoporous silicon containing polymer composition layer on the substrate, which layer has a first region of a graded density, high porosity, low dielectric constant, nanoporous silicon containing polymer composition positioned between the raised lines and second region of a graded density, low porosity, high dielectric constant, nanoporous silicon containing polymer composition positioned on top of the lines, wherein the difference between the average refractive index of the second region and the average refractive index of the first region ranges from about 0.03 to about 0.06.

The invention further provides a semiconductor device which comprises a substrate which comprises a substrate, a plurality of raised lines on the substrate, a single, monolithic nanoporous silicon containing polymer composition layer on the substrate, which layer has a first region of a graded density, high porosity, low dielectric constant, nanoporous silicon containing polymer composition positioned between the raised lines and second region of a graded density, low porosity, high dielectric constant, nanoporous silicon containing polymer composition positioned on top of the lines, wherein the difference between the average refractive index of the second region and the average refractive index of the first region ranges from about 0.03 to about 0.06.

The invention also provides a process for forming a multidensity nanoporous dielectric coating on a substrate having raised pattern lines which comprises a) blending at least one alkoxysilane with a relatively high volatility solvent composition, a relatively low volatility solvent composition and optional water thus forming a mixture and causing a partial hydrolysis and partial condensation of the alkoxysilane;

b) depositing the mixture onto a substrate having a raised pattern of lines such that the mixture is positioned both between the lines and on the lines, while evaporating at least a portion of the relatively high volatility solvent composition;

c) exposing the mixture to a water vapor and a base vapor; and d) evaporating the relatively low volatility solvent composition, thereby forming a single, monolithic nanoporous silicon containing polymer composition layer on the substrate, which layer has a first region of a graded density, high porosity, low dielectric constant, nanoporous silicon containing polymer composition positioned between the raised lines and second region of a graded density, low porosity, high dielectric constant, nanoporous silicon containing polymer composition positioned on top of the lines, wherein the difference between the average refractive index of the second region and the average refractive index of the first region ranges from about 0.03 to about 0.06.

It has now been found that a nanoporous silica film can be produced with two regions of density. A nanoporous silica with a relatively lower density, lower dielectric constant insulator is produced between metal lines and a relatively higher density, higher dielectric constant, denser porosity layer is formed on top of the lines. The dielectric constant of the insulation is controlled by controlling the number and type of alkoxy groups on silica oligomers (i.e., the silicon containing polymer). These alkoxy groups are removed at a certain point in the process in order to obtain a lower density, lower dielectric constant in the portion of the film which is in the trenches between metal lines.

BRIEF DESCRIPTION OF THE DRAWINGS

FIG. 1 is a schematic representation of a substrate having a pattern of metal lines.

FIG. 2 is a schematic representation of the patterned substrate coated with an alkoxysilane composition before reaction.

FIG. 3 is a schematic representation of the patterned and coated substrate after reaction.

DETAILED DESCRIPTION OF THE PREFERRED EMBODIMENT

The invention forms a reaction product of at least one alkoxysilane with a relatively high volatility solvent composition, a relatively low volatility solvent composition, optional water and an optional catalytic amount of an acid. This reaction product is applied onto a substrate having raised lines, such as metal or oxide lines in such a manner that the blend is deposited both between the lines and on top of the lines. The high volatility solvent evaporates during and immediately after deposition of the reaction product. The reaction product is further hydrolyzed and condensed until it forms a gel layer and the portion on top of the lines shrinks. The metal lines support the gel and hinder gel shrinkage between the lines, thus producing a relatively less dense, higher porosity, lower dielectric constant silica between the lines. However, the gel on top of the lines is not so supported and shrinks. This shrinkage produces a relatively denser, lower porosity, higher dielectric constant silica on top of the metal lines. Assuming that no shrinkage occurs after gelation, the density/dielectric constant of the top film is fixed by the volume ratio of low volatility solvent to silica. The second solvent is then removed by increasing the temperature.

Useful alkoxysilanes for this invention include those which have the formula:

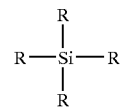

wherein at least 2 of the R groups are independently $C_1$ to $C_4$ alkoxy groups and the balance, if any, are independently selected from the group consisting of hydrogen, alkyl, phenyl, halogen, substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

The alkoxysilane is reacted with a relatively high volatility solvent composition, a relatively low volatility solvent composition, optional water and optional catalytic amount of an acid. Water is included to provide a medium for hydrolyzing the alkoxysilane.

The relatively low volatility solvent composition is one which evaporates at a temperature below, preferably significantly below that of the relatively low volatility solvent composition. The relatively high volatility solvent composition preferably has a boiling point of about 120° C. or less, preferably about 100° C. or less. Suitable high volatility solvent composition nonexclusively include methanol, ethanol, n-propanol, isopropanol, n-butanol and mixtures thereof. Other relatively high volatility solvent compositions which are compatible with the other ingredients can be readily determined by those skilled in the art.

The relatively high volatility solvent composition is one which evaporates at a temperature above, preferably significantly above that of the relatively high volatility solvent composition. The relatively low volatility solvent composition preferably has a boiling point of about 175° C. or more, preferably about 200° C. or more. Suitable low volatility solvent compositions nonexclusively include alcohols and polyols including glycols such as ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4,1,4-butanediol, 2-methyl-1,3-propanediol, tetraethylene glycol, triethylene glycol monomethyl ether, glycerol and mixtures thereof. Other relatively low volatility solvent compositions which are compatible with the other ingredients can be readily determined by those skilled in the art.

The optional acid serves to catalyze the reaction of the alkoxysilane with the relatively high volatility solvent composition, a relatively low volatility solvent composition and water. Suitable acids are nitric acid and compatible organic acids which are volatile, i.e. which evaporate from the resulting reaction product under the process operating conditions, and which do not introduce impurities into the reaction product.

The alkoxysilane component is preferably present in an amount of from about 3% to about 50% by weight of the overall blend. A more preferred range is from about 5% to about 45% and most preferably from about 10% to about 40%.

The high volatility solvent composition component is preferably present in an amount of from about 20% to about 90% by weight of the overall blend. A more preferred range is from about 30% to about 70% and most preferably from about 40% to about 60%.

The low volatility solvent composition component is preferably present in an amount of from about 1 to about 40% by weight of the overall blend. A more preferred range is from about 3% to about 30% and most preferably from about 5% to about 20%.

The mole ratio of water to silane is preferably from about 0 to about 50. A more preferred range is from about 0.1 to about 10 and most preferably from about 0.5 to about 1.5.

The acid is present in a catalytic amount which can be readily determined by those skilled in the art. Preferably the molar ratio of acid to silane ranges from about 0 to about 0.2, more preferably from about 0.001 to about 0.05, and most preferably from about 0.005 to about 0.02.

The alkoxysilane containing composition is then coated on a substrate having a pattern of lines on its surface and forms a dielectric film on the surface. As best seen in FIGS. 1 and 2, a substrate 2 having an array of patterned lines 4 is applied with a layer 6 of the silica precursor composition. The layer 6 is relatively uniformly applied so that it is positioned both between and on top of the lines 6. The lines are lithographically formed and may be composed of a metal, an oxide, a nitride or an oxynitride. Suitable materials include silica, silicon nitride, titanium nitride, tantalum nitride, aluminum, aluminum alloys, copper, copper alloys, tantalum, tungsten and silicon oxynitride. These lines form the conductors or insulators of an integrated circuit.

The higher volatility layer is then partially evaporated. The more volatile solvent evaporates over a period of seconds or minutes resulting in film shrinkage. At this point, the film is a viscous liquid of the silica precursors and the less volatile solvent. Slightly elevated temperatures may optionally be employed to accelerate this step. Such temperatures may range from about 20° C. to about 80° C., preferably range from about 20° C. to about 50° C. and more range from about 20° C. to about 35° C.

Typical substrates are those suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof. On the surface of the substrate is a pattern of raised lines, such as metal, oxide, nitride or oxynitride lines which are formed by well known lithographic techniques. Such are typically closely separated from one another at distances of about 20 micrometers or less, preferably 1 micrometer or less, and more preferably from about 0.05 to about 1 micrometer.

Then the coating is exposed to both a water vapor and a base vapor. The base vapor may be introduced first followed by the water vapor or both the water vapor and the base vapor may be introduced simultaneously. The water vapor causes a continued hydrolysis of the alkoxysilane alkoxy groups, and the base catalyzes condensation of the hydrolyzed alkoxysilane and serves to increase molecular weight until the coating gels and ultimately increases gel strength. The coating between the lines is constrained and supported by the lines and hence does not substantially shrink and forms a relatively less dense, high porosity, low dielectric constant material. The silicon containing polymer composition between the lines preferably has a dielectric constant of from about 1.1 to about 2.5, more preferably from about 1.1 to about 2.2, and most preferably from about 1.5 to about 2.0. The pore size ranges from about 2 nm to about 200 nm, more preferably from about 5 nm to about 50 nm, and most preferably from about 10 nm to about 30 nm. The density of the silicon containing composition, including pores ranges from about 0.1 to about 1.2 $g/cm^2$, more preferably from about 0.25 to about 1 $g/cm^2$, and most preferably from about 0.4 to about 0.8 $g/cm^2$.

The coating above the lines is not constrained and hence shrinks and densifies to a low porosity material. If the condensation rate is much faster than hydrolysis, a significant number of alkoxy groups will remain after the gel point. If little hydrolysis has occurred, then the film will not shrink and still maintains the same thickness as at the coating step. Continued exposure to basic water vapor results in continued hydrolysis of alkoxy groups forming silanols and the generation of volatile alcohols. These product alcohols leave the coating film causing shrinkage in the region above the lines in contrast to the gel in the trenches between lines which is constrained by the walls and bottom of the trench by adhesion to the walls, does not shrink and hence produces a high porosity material. The film is then dried in a conventional way by solvent evaporation of the less volatile solvent with no further shrinkage. Elevated temperatures may be employed to dry the coating in this step. Such temperatures may range from about 20° C. to about 450° C. preferably from about 50° C. to about 350° C. and more preferably from about 175° C. to about 320° C. As a result, a relatively high porosity, low dielectric constant, silicon containing polymer composition forms between the raised lines and a relatively low porosity, high dielectric constant, silicon containing polymer composition is formed on the lines. The silicon containing polymer composition on top of the lines preferably has a dielectric constant of from about 1.3 to about 2.9, more preferably from about 1.5 to about 2.9, and most preferably from about 1.8 to about 2.5. Preferably the dielectric constant of the silicon containing polymer composition between the lines is at least about 0.2 less than the dielectric constant of the silicon containing polymer composition on top of the lines. The pore size of silica composition on top of the lines ranges from about 1 nm to about 100 nm, more preferably from about 2 nm to about 30 nm, and most preferably from about 3 nm to about 20 nm. The density of the silicon containing composition on top of the lines, including the pores, ranges from about 0.25 to about 1.9 $g/cm^2$, more preferably from about 0.4 to about 1.6 $g/cm^2$, and most preferably from about 0.7 to about 1.2 $g/cm^2$.

The single coating layer on the substrate is monolithic and has a gradient of dielectric constant ranging from the top of the upper region on the lines to the bottom of the lower region between the lines. The difference between the average dielectric constant of the region on top of the lines and the average dielectric constant of the region between the lines ranges from about 0.2 to about 0.4 and more preferably from about 0.3 to about 0.4. The difference between the average refractive index of the region between the lines and the average refractive index of the region above the lines ranges from about 0.03 to about 0.06, preferably from about 0.04 to about 0.06.

FIG. 3 shows a zone 8 of relatively high density, low porosity, high dielectric constant silica formed on the lines 4 and a zone 10 of relatively high porosity, low density, low dielectric constant silica formed between lines 4. The area 8 above the lines 4 is contracted as compared to FIG. 2. The density difference is controlled by the degree of hydrolysis of alkoxy groups after the film has gelled. The magnitude of the density difference between the two layers is fixed by the number and size of the alkoxy groups removed after the gel point. As examples, alkoxy group size can be controlled by different alcohols such as methanol, ethanol, n-propanol, isopropanol, or diols such as ethylene glycol or propylene glycol or any other organic group which can be readily cleaved from silicon at temperatures near room temperature by hydrolysis. The number of groups can be controlled by the relative concentrations of water and precursor alcohols in the starting reaction mass as well as the time temperature-concentration of water vapor and base vapor applied to the film after deposition.

Suitable bases for use in the base vapor nonexclusively include ammonia and amines, such as primary, secondary and tertiary alkyl amines, aryl amines, alcohol amines and mixtures thereof which have a boiling point of about 200° C. or less, preferably 100° C. or less and more preferably 25° C. or less. Preferred amines are methyl amine, dimethyl amine, trimethyl amine, n-butyl amine, n-propyl amine, tetramethyl ammonium hydroxide, piperidine and 2-methoxyethyl amine. The ability of an amine to accept a proton in water is measured in terms of the basicity constant $K_b$, and $pK_b=-\log K_b$. In the preferred embodiment, the $pK_b$ of the base may range from about less than 0 to about 9. A more preferred range is from about 2 to about 6 and most preferably from about 4 to about 5.

In the preferred embodiment, the mole ratio of water vapor to base vapor ranges from about 1:3 to about 1:100, preferably from about 1:5 to about 1:50, and more preferably from about 1:10 to about 1:30.

When one processes the coating with high base vapor (catalyst) concentration and limited water vapor, the silica polymer polymerizes and gels with significant concentration of alkoxy groups remaining on the internal silica surface. After hydrolysis, the alkoxy groups hydrolyze and the product alcohol evaporates. If the gel is unconstrained, it will shrink and if it is constrained in a trench, it will not shrink and yield lower density/dielectric constant. The dielectric constant (density) in the low density gap region depends on the target dielectric constant formulation which is fixed by the pore control solvent to silica volumetric ration, the size of the alkoxy groups and the ratio of alkoxy groups per silicon atoms at the point when the silica polymer has gelled. This is calculated for three common alkoxy groups (methoxy, ethoxy, and n-butoxy) for three different target dielectric constants and a range of OR/Si mole ratios and is shown below. When the mole ratio of OR/Si is near zero, as in conventional processing there is no differential shrinkage. However, when processed according to this invention, the OR/Si ratio at the gelation point is between 0.2 and 2. For example, if the OR/Si ratio is one, one uses ethoxy groups, and the target dielectric constant is 2.5, significant differential dielectric constants will be observed. The value on the top (unconstrained) is 2.5 and the value of the dielectric constant in the gaps will be 1.75. For different alkoxy groups, as the molar volume of the alkoxy group increases (n-butoxy>ethoxy>methoxy), the extent of differential dielectric constant increases. The extent of shrinkage after gelation and before final cure is a good measure of the volume change from dealkoxylation.

The following non-limiting examples serve to illustrate the invention.

EXAMPLE 1 (COMPARATIVE)

This example illustrates a process wherein no discernible differential density is observed for a film with a target top layer dielectric constant K of 1.3. A precursor is reacted with water and base before deposition which reduces the OR:Si ratio, and deposited onto a patterned wafer, aged for 3 minutes, solvent exchanged, and dried.

A precursor was synthesized by adding 61.0 mL of tetraethoxysilane, 61.0 mL of tetraethylene glycol, 4.87 mL of deionized water, and 0.2 mL of 1N nitric acid together in a round bottom flask. The solution was allowed to mix vigorously then heated to ~80° C. and refluxed for 1.5 hours to form a solution. After the solution was allowed to cool, the solution was diluted with ethanol to reduce the viscosity and achieve a desirable thickness. The diluted precursor was filtered to 0.1 $\mu$m using a teflon filter. The precursor was pre-catalyzed by adding 1 mL of 0.5M ammonium hydroxide to 10 ml of the above solution and mixed for ~15 seconds. Approximately 3.0 ml of this pre-catalyzed precursor was deposited onto a 6 inch patterned wafer on a spin chuck, and spun on at 2500 rpm for 30 seconds to form films. The films were aged for 10.0 min. statically by adding 1 ml of 15M ammonium hydroxide to the bottom of a petri dish. A film is placed on a stand in the petri dish and the dish is covered. Water and ammonia from the base are evaporated in the dish and allowed to diffuse into the film to promote gelation. The films were then solvent exchanged in a two step process by which ~20 mL of ethanol was spun on the film at 250 rpm for 10 seconds without allowing the film to dry. Approximately 20 mL of hexamethyldisilazane was immediately spun on the film at 250 rpm for 10 seconds. The films were heated at elevated temperatures for 1 min. each at 175° C. and 320° C. in air. The films were cleaved to 1 inch squares and inspected by scanning electron microscopy (SEM). SEM photographs were taken at magnifications between 10,000× and 50,000× in between the patterned lines to observe the density throughout the film. No discernible density gradient was observed in the SEM photos.

EXAMPLE 2

This example illustrates a process wherein a very slight differential density is observed for a film with a target top layer dielectric constant K of 1.3. A precursor is deposited onto a patterned wafer, aged for 3 minutes, solvent exchanged, and dried.

A precursor was synthesized by adding 61.0 mL of tetraethoxysilane, 61.0 mL of tetraethylene glycol, 4.87 mL of deionized water, and 0.2 mL of 1N nitric acid together in a round bottom flask. The solution was allowed to mix vigorously then heated to ~80° C. and refluxed for 1.5 hours to form a solution. After the solution was allowed to cool, the solution was diluted with ethanol to reduce the viscosity and achieve a desirable thickness. The diluted precursor was filtered to 0.1 $\mu$m using a teflon filter. Approximately 3.0 ml of the precursor was deposited onto a 6 inch patterned wafer on a spin chuck, and spun on at 2500 rpm for 30 seconds. The films were aged for 10.0 min. statically by adding 1 ml of 15M ammonium hydroxide to the bottom of a petri-dish. A film is placed on a stand in the petri-dish and the dish is covered. Water and ammonia from the base are evaporated in the dish and allowed to diffuse into the film to promote aging. The films were then solvent exchanged in a two step process by which ~20 mL of ethanol was spun on the film at 250 rpm for 10 seconds without allowing the film to dry. Approximately 20 mL of hexamethyldisilazane was immediately spun on the film at 250 rpm for 10 seconds. The films were heated at elevated temperatures for 1 min. each at 175° C. and 320° C. in air. The films were cleaved to 1 squares and inspected by scanning electron microscopy (SEM). SEM photographs were taken at magnifications between 10,000× and 50,000× in between the patterned lines to observe the density throughout the film. A slight density gradient was observed in the SEM photos. The material in between the metal lines showed a slightly lower density than the material on top of the lines.

EXAMPLE 3 (COMPARATIVE)

This example illustrates a process wherein no discernible differential density is observed for a film with a target top layer dielectric constant K of 1.8. The precursor is reacted with water and base before deposition which reduces the OR:Si ratio, and deposited onto a patterned wafer, aged for 3 minutes, solvent exchanged, and dried.

A precursor was synthesized by adding 208.0 mL of tetraethoxysilane, 61.0 mL of tetraethylene glycol, 16.8 mL of deionized water, and 0.67 mL of 1N nitric acid together in a round bottom flask. The solution was allowed to mix vigorously then heated to ~80° C. and refluxed for 1.5 hours to form a solution. After the solution was allowed to cool, the solution was diluted with ethanol to reduce the viscosity and achieve a desirable thickness. The diluted precursor was filtered to 0.1 $\mu$m using a teflon filter. The precursor was pre-catalyzed by adding 1 mL of 0.5M ammonium hydroxide to 10 ml of the above solution and mixed for ~15 seconds. Approximately 3.0 ml of this pre-catalyzed precursor was deposited onto a 6 inch patterned wafer on a spin chuck, and spun on at 2500 rpm for 30 seconds. The films were aged for 10.0 min. statically by adding 1 ml of 15M ammonium hydroxide to the bottom of a petri-dish. A film is placed on a stand in the petri-dish and the dish is covered. Water and ammonia from the base are evaporated in the dish and allowed to diffuse into the film to promote aging. The films were then solvent exchanged in a two step process by which ~20 mL of ethanol was spun on the film at 250 rpm for 10 seconds without allowing the film to dry. Approximately 20 mL of hexamethyldisilazane was immediately spun on the film at 250 rpm for 10 seconds. The films were heated at elevated temperatures for 1 min. each at 175° C. and 320° C. in air. The films were cleaved to 1 inch squares and inspected by scanning electron microscopy (SEM). SEM photographs were taken at magnifications between 10,000× and 50,000× in between the patterned lines to observe the density throughout the film. No discernible density gradient was observed in the SEM photos

EXAMPLE 4

This example illustrates a process wherein a pronounced differential density is observed for a film with a target top layer dielectric constant K of 1.8. The precursor is deposited onto a patterned wafer, aged for 3 minutes, solvent exchanged, and dried. A precursor was synthesized by adding 208.0 mL of tetraethoxysilane, 61.0 mL of tetraethylene glycol, 16.8 mL of deionized water, and 0.67 mL of IN nitric acid together in a round bottom flask. The solution was allowed to mix vigorously then heated to ~80° C. and refluxed for 1.5 hours to form a solution. After the solution was allowed to cool, the solution was diluted with ethanol to reduce the viscosity and achieve a desirable thickness. The diluted precursor was filtered to 0.1 $\mu$m using a teflon filter. Approximately 3.0 ml of precursor was deposited onto a 6 inch patterned wafer on a spin chuck, and spun on at 2500 rpm for 30 seconds. The films were aged for 10.0 min. statically by adding 1 ml of 15M ammonium hydroxide to the bottom of a petri-dish. A film is placed on a stand in the petri-dish and the dish is covered. Water and ammonia from the base are evaporated in the dish and allowed to diffuse into the film to promote aging. The films were then solvent exchanged in a two step process by which 20 mL of ethanol was spun on the film at 250 rpm for 10 seconds without allowing the film to dry. Approximately 20 mL of hexamethyldisilazane was immediately spun on the film at 250 rpm for 10 seconds. The films were heated at elevated temperatures for 1 min. each at 175° C. and 320° C. in air. Focus Ion Beam (FIB) analysis was done to minimize damage as a result of cleaving the sample during sample preparation. The films were then inspected by scanning electron microscopy (SEM). SEM photographs were taken at magnifications between 10,000× and 50,000× in between the patterned lines to observe the density throughout the film. The films showed a pronounced difference in density. The material in between the lines showed a much lower density then the material on top of the lines.

From the above examples and disclosure, one can see that by following the process of the invention, a silicon containing polymer composition having a low density is formed between patterned lines on a semiconductor substrate while the silicon containing polymer composition on top of the lines has a high density.

What is claimed is:

1. A multidensity nanoporous dielectric coated substrate which comprises a substrate, a plurality of raised lines on the substrate, a single, monolithic nanoporous silicon containing polymer composition layer on tie substrate, which monolithic nanoporous silicon containing polymer composition layer has a first region of a graded density, high porosity, low dielectric constant, nanoporous silicon containing polymer composition positioned between the raised lines and second region of a graded density, low porosity, high dielectric constant, nanoporous silicon containing polymer composition positioned on top of the lines, wherein die difference between the average refractive index of the second region and the average refractive index of the first region ranges from about 0.03 to about 0.06.

2. The multidensity coated substrate of claim 1 wherein the difference between the average refractive index of the second region and the average refractive index of the first region ranges from about 0.04 to about 0.06.

3. The multidensity coated substrate of claim 1 wherein the difference between the average dielectric constant of the second region and the average dielectric constant of the first region ranges from about 0.2 to about 0.4.

4. The multidensity coated substrate of claim 1 wherein the difference between the average dielectric constant of the second region and the average dielectric constant of the first region ranges from about 0.3 to about 0.4.

5. The multidensity coated substrate of claim 1 wherein the high porosity, low dielectric constant, silicon containing composition has a dielectric constant of from about 1.1 to about 2.5.

6. The multidensity coated substrate of claim 1 wherein the low porosity, high dielectric constant, silicon containing composition has a dielectric constant of from about 1.3 to about 2.9.

7. The multidensity coated substrate of claim 1 wherein the high porosity, low dielectric constant, silicon containing composition has a dielectric constant which is at least about 0.2 less than that of the low porosity, high dielectric constant, silicon containing composition.

8. The multidensity coated substrate of claim 1 wherein the raised pattern of lines comprises a metal, an oxide, a nitride and/or an oxynitride material.

9. The multidensity coated substrate of claim 1 wherein the substrate comprises a semiconductor material.

10. The multidensity coated substrate of claim 1 wherein the substrate comprises silicon or gallium arsenide.

11. A semiconductor device which comprises a substrate, a plurality of raised lines on the substrate, a single, monolithic nanoporous silicon containing polymer composition layer on the substrate, which monolithic nanoporous silicon containing polymer composition layer has a first region of a graded density, high porosity, low dielectric constant, nanoporous silicon containing polymer composition positioned between the raised lines and second region of a graded density, low porosity, high dielectric constant, nanoporous silicon containing polymer composition positioned on top of the lines, wherein the difference between the average refractive index of the second region and the average refractive index of the first region ranges from about 0.03 to about 0.06.

12. A process for forming a multidensity nanoporous dielectric coating on a substrate having raised pattern lines which comprises
   a) blending at least one alkoxysilane with a relatively high volatility solvent composition, a relatively low volatility solvent composition and optional water thus forming a mixture and causing a partial hydrolysis and partial condensation of the alkoxysilane;
   b) depositing the mixture onto a substrate having a raised pattern of lines such that the mixture is positioned both between the lines and on the lines, while evaporating at least a portion of the relatively high volatility solvent composition;
   c) exposing the mixture to a water vapor and a base vapor; and
   d) evaporating the relatively low volatility solvent composition, thereby forming a single, monolithic nanoporous silicon containing polymer composition layer on the substrate, which monolithic nanoporous silicon containing polymer composition layer has a first region of a graded density, high porosity, low dielectric constant, nanoporous silicon containing polymer composition positioned between the raised lines and second region of a graded density, low porosity, high dielectric constant, nanoporous silicon containing polymer composition positioned on top of the lines, wherein the difference between the average refractive index of the second region and the average refractive index of the first region ranges from about 0.03 to about 0.06.

13. The process of claim 12 wherein the difference between the average refractive index of the second region and the average refractive index of the first region ranges from about 0.04 to about 0.06.

14. The process of claim 12 wherein the difference between the average dielectric constant of the second region and the average dielectric constant of the first region ranges from about 0.2 to about 0.4.

15. The process of claim 12 wherein the difference between the average dielectric constant of the second region and the average dielectric constant of the first region ranges from about 0.3 to about 0.4.

16. The process of claim 12 wherein the high porosity, low dielectric constant, silicon containing composition has a dielectric constant of from about 1.1 to about 2.5.

17. The process of claim 12 wherein the low porosity, high dielectric constant, silicon containing composition has a dielectric constant of from about 1.3 to about 2.9.

18. The process of claim 12 wherein the high porosity, low dielectric constant, silicon containing composition has a dielectric constant which is at least about 0.2 less than that of the low porosity, high dielectric constant, silicon containing composition.

19. The process of claim 12 wherein the raised pattern of lines comprises a metal, an oxide, a nitride and/or an oxynitride material.

20. The process of claim 12 wherein the substrate comprises a semiconductor material.

21. The process of claim 12 wherein the substrate comprises silicon or gallium arsenide.

* * * * *